(12) United States Patent
Zhang et al.

(10) Patent No.: US 11,854,186 B2
(45) Date of Patent: Dec. 26, 2023

(54) COMPARISON METHOD AND MODELING METHOD FOR CHIP PRODUCT, DEVICE AND STORAGE MEDIUM

(71) Applicant: CHANGXIN MEMORY TECHNOLOGIES, INC., Hefei (CN)

(72) Inventors: Jiemei Zhang, Hefei (CN); Gehua Shen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 182 days.

(21) Appl. No.: 17/389,735

(22) Filed: Jul. 30, 2021

(65) Prior Publication Data

US 2022/0092759 A1     Mar. 24, 2022

Related U.S. Application Data

(63) Continuation of application No. PCT/CN2021/097394, filed on May 31, 2021.

(30) Foreign Application Priority Data

Sep. 23, 2020   (CN) .......................... 202011010056.7

(51) Int. Cl.
*G06T 7/00* (2017.01)
*G06T 19/00* (2011.01)
(Continued)

(52) U.S. Cl.
CPC ............ *G06T 7/001* (2013.01); *G06T 19/003* (2013.01); *G06V 10/754* (2022.01);
(Continued)

(58) Field of Classification Search
CPC .................. G06T 7/001; G06T 19/003; G06T 2207/10021; G06T 2207/20084;
(Continued)

(56) References Cited

U.S. PATENT DOCUMENTS 5,461,709 A * 10/1995 Brown ................ G06F 3/04845
715/848
2008/0294281 A1   11/2008 Shimshi
(Continued)

FOREIGN PATENT DOCUMENTS

| CN | 105701263 A | 6/2016 |
|---|---|---|
| CN | 104101330 B | 1/2017 |

(Continued)

OTHER PUBLICATIONS

CN110133014A, Wang et al, Google translated, 2019 (Year: 2019).*
(Continued)

*Primary Examiner* — Jianxun Yang
(74) *Attorney, Agent, or Firm* — Cooper Legal Group, LLC

(57) ABSTRACT

The present application provides a comparison method and a modeling method for a chip product, a device and a storage medium. According to the method, the chip product is modeled by using a neural network based on a slice sequence of the chip product in advance to obtain a three-dimensional stereoscopic model. When the chip products are compared, a comparison feature is acquired responsive to an operation of a user. For each chip product, a comparison result corresponding to the comparison feature is acquired from the three-dimensional stereoscopic model corresponding to each chip product. Then, the comparison result corresponding to each chip product is displayed.

12 Claims, 9 Drawing Sheets

(51) Int. Cl.
*G06V 10/75* (2022.01)
*G06V 20/64* (2022.01)

(52) U.S. Cl.
CPC .. *G06V 20/647* (2022.01); *G06T 2207/10021* (2013.01); *G06T 2207/20084* (2013.01); *G06T 2207/30148* (2013.01); *G06T 2219/012* (2013.01)

(58) Field of Classification Search
CPC ..... G06T 2207/30148; G06T 2219/012; G06T 17/00; G06V 10/754; G06V 20/647; G06V 10/82; G06F 30/398; G06N 3/02
See application file for complete search history.

(56) References Cited

U.S. PATENT DOCUMENTS

| | | |
|---|---|---|
| 2016/0147908 A1 | 5/2016 | Ni et al. |
| 2018/0299770 A1 | 10/2018 | Ten Berge |
| 2019/0257767 A1 | 8/2019 | Shaubi |
| 2020/0027021 A1 | 1/2020 | Sastry |
| 2021/0374936 A1 | 12/2021 | Koopman |
| 2022/0327686 A1 | 10/2022 | Koopman et al. |
| 2022/0383584 A1* | 12/2022 | Sievert ................. G06T 17/00 |

FOREIGN PATENT DOCUMENTS

| | | |
|---|---|---|
| CN | 109685147 A | 4/2019 |
| CN | 110133014 A | 8/2019 |
| CN | 108038874 B | 7/2020 |
| JP | 2019082381 A | 5/2019 |
| TW | 201942769 A | 11/2019 |

OTHER PUBLICATIONS

"Three-dimensional model matching software to design change rapid and accurate transmission of information", Mar. 2019, Alex Software, Reprinted from the Internet at: https://zhuanlan.zhihu.com/p/58476998, 8 pgs.

Supplementary European Search Report in the European application No. 21844610.2, dated May 9, 2023. 11 pages.

* cited by examiner

COMPARISON METHOD AND MODELING METHOD FOR CHIP PRODUCT, DEVICE AND STORAGE MEDIUM

CROSS-REFERENCE TO RELATED APPLICATIONS

This application is a continuation of International Application No. PCT/CN2021/097394, filed on May 31, 2021, which claims priority to Chinese Patent Application No. 202011010056.7, filed on Sep. 23, 2020. The disclosures of International Application No. PCT/CN2021/097394 and Chinese Patent Application No. 202011010056.7 are hereby incorporated by reference in their entireties.

TECHNICAL FIELD

The present disclosure relates to the field of semiconductors, and particularly to a comparison method and a modeling method for a chip product, a device and a storage medium.

BACKGROUND

Chip is a general name for a semiconductor element product. In the field of semiconductors, the chip, or called an Integrated Circuit (IC), a microcircuit or a microchip is a miniaturized circuit (mainly including a semiconductor device, as well as a passive component, etc.) in electronics and generally manufactured on a semiconductor wafer surface.

At present, a method for comparing and analyzing a chip product includes the following operations. After the chip product is analyzed, a series of discontinuous two-dimensional pictures are acquired, and specific information of a related parameter is manually marked on the picture by a professional. The parameter of chip product and the pictures are manually sorted and stored via an electronic file. When comparison and analysis is performed, the electronic file of the chip product to be compared and checked needs to be selected, and various parameter values are searched from the electronic files for manual comparison.

However, when multiple chip products are compared through the above solution, multiple electronic files need to be opened at the same time to compare multiple pictures, and a large amount of information is marked on each picture, so that the efficiency of the comparison work is low, and a manual comparison manner is relatively poor in accuracy.

SUMMARY

Embodiments of the present disclosure provide a comparison method and a modeling method for a chip product, a device and a storage medium, to improve the comparison efficiency and accuracy of the chip product.

In a first aspect, an embodiment of the present disclosure provides a comparison method of a chip product, the method includes the following operations.

When a comparison task for at least two chip products is acquired, a comparison feature is acquired responsive to an operation of a user.

For each chip product, a comparison result corresponding to the comparison feature is acquired from a three-dimensional stereoscopic model corresponding to the chip product. The three-dimensional stereoscopic model corresponding to each chip product is a three-dimensional model which is recombined and constructed by using a neural network according to a slice sequence of the chip product.

The comparison result corresponding to each chip product is displayed.

In one specific embodiment, the comparison feature includes three-dimensional position coordinates or parameter information of the chip product required to be compared. The operation that the comparison feature is acquired responsive to the operation of the user includes the following operations.

Responsive to a position being selected by the user in the three-dimensional stereoscopic model of any one of the at least two chip products, the three-dimensional position coordinates corresponding to the selected position are acquired.

Or, the parameter information of the chip product required to be compared input by the user is received.

In another specific embodiment, the comparison feature includes the three-dimensional position coordinates of the chip product required to be compared, the operation that for each chip product, the comparison result corresponding to the comparison feature is acquired from a three-dimensional stereoscopic model corresponding to the chip product includes the following operations.

For each chip product, a two-dimensional plane position is positioned in the three-dimensional stereoscopic model corresponding to the chip product according to the three-dimensional position coordinates.

A slice image corresponding to the two-dimensional plane position is acquired from the slice sequence corresponding to the chip product.

Parameter information at the three-dimensional position coordinates is acquired from stored parameters of the chip product.

The comparison result includes the slice image and the parameter information.

In another specific embodiment, the comparison feature includes the parameter information of the chip product required to be compared, the operation that for each chip product, the comparison result corresponding to the comparison feature is acquired from the three-dimensional stereoscopic model corresponding to the chip product includes the following operations.

For each chip product, the three-dimensional position coordinates corresponding to the parameter information are positioned in the three-dimensional stereoscopic model corresponding to the chip product.

The two-dimensional plane position is positioned in the three-dimensional stereoscopic model corresponding to the chip product according to the three-dimensional position coordinates.

A slice image corresponding to the two-dimensional plane position is acquired from the slice sequence corresponding to the chip product.

The comparison result includes the three-dimensional position coordinates and the slice image.

In yet another specific embodiment, the comparison result further includes at least one of the parameter information or the two-dimensional plane position.

In another specific embodiment, the operation that the two-dimensional plane position is positioned in the three-dimensional stereoscopic model corresponding to the chip product according to the three-dimensional position coordinates includes the following operation.

The two-dimensional plane position corresponding to the three-dimensional position coordinates is positioned in the three-dimensional stereoscopic model corresponding to the chip product by adopting a neural network stereoscopic vision positioning.

In another specific embodiment, the operation that the comparison result corresponding to each chip product is displayed includes the following operation.

The corresponding comparison result is displayed in the three-dimensional stereoscopic model corresponding to each chip product in a graphical user interface.

Or, the comparison result corresponding to each chip product is displayed in a preset region for displaying the comparison result in the graphical user interface.

In a second aspect, an embodiment of the present disclosure provides a modeling method for a chip product, the method includes the following operations.

A slice sequence of a to-be-modeled chip product is acquired. The slice sequence includes multiple continuous slice images acquired by slicing the chip product.

According to the slice sequence, recombination and construction are performed by using a neural network to acquire a three-dimensional stereoscopic model corresponding to the chip product. The three-dimensional stereoscopic model is used for comparison of parameter information and the slice image between chip products when the chip products are compared.

In one specific embodiment, the neural network includes a residual network, a U-net network model, and a multi-granularity network model. The operation that according to the slice sequence, recombination and construction are performed by using the neural network to acquire a three-dimensional stereoscopic model corresponding to the chip product includes the following operations.

Each slice image in the slice sequence is input into the residual network for feature extraction to acquire a first image feature of each slice image.

The slice sequence is segmented through the U-net network model. Each slice image in the segmented slice sequence is input into the residual network for feature extraction to acquire a second image feature of each slice image.

The first image feature and the second image feature of each slice image are merged to acquire an image feature of the slice image.

The three-dimensional stereoscopic model corresponding to the chip product is constructed by adopting the multi-granularity network model according to the slice sequence and the image feature of each slice image.

In another specific embodiment, the operation that the three-dimensional stereoscopic model corresponding to the chip product is constructed by adopting the multi-granularity network model includes the following operations according to the slice sequence and the image feature of each slice image.

A grid-shaped three-dimensional geometric shape is generated according to multiple slice images in the slice sequence by adopting the multi-granularity network model and by taking a center of the chip product as the center of a three-dimensional coordinate system.

The image feature of each slice image is embedded into the three-dimensional geometric shape and training is performed to obtain the three-dimensional stereoscopic model.

In yet another specific embodiment, the image feature of each slice image in the slice sequence includes: a structural feature in the slice image and information about correlation between the slice image and preceding and following images of the slice image in the slice sequence.

In a third aspect, an embodiment of the present disclosure provides a comparison device of a chip product, the device includes: an acquiring module, a processing module, and a displaying module.

The acquiring module is configured to, when a comparison task for at least two chip products is acquired, acquire a comparison feature responsive to an operation of a user.

The processing module is configured to, for each chip product, acquire a comparison result corresponding to the comparison feature from a three-dimensional stereoscopic model corresponding to the chip product. The three-dimensional stereoscopic model corresponding to each chip product is a three-dimensional model which is recombined and constructed by using a neural network according to a slice sequence of the chip product.

The displaying module is configured to display the comparison result corresponding to each chip product.

Optionally, the comparison feature includes three-dimensional position coordinates or parameter information of the chip product required to be compared. The acquiring module is specifically configured to perform the following operation.

Responsive to a position being selected by the user in the three-dimensional stereoscopic model of any one of the at least two chip products, the three-dimensional position coordinates corresponding to the selected position are acquired.

Or, the parameter information of the chip product required to be compared input by the user is received.

Optionally, the comparison feature includes the three-dimensional position coordinates of the chip product required to be compared. The processing module is specifically configured to perform the following operations.

For each chip product, a two-dimensional plane position is positioned in the three-dimensional stereoscopic model corresponding to the chip product according to the three-dimensional position coordinates.

A slice image corresponding to the two-dimensional plane position is acquired from the slice sequence corresponding to the chip product.

Parameter information at the three-dimensional position coordinates is acquired from stored parameters of the chip product.

The comparison result includes the slice image and the parameter information.

Optionally, the comparison feature includes the parameter information of the chip product required to be compared. The processing module is specifically configured to perform the following operations.

For each chip product, the three-dimensional position coordinates corresponding to the parameter information are positioned in the three-dimensional stereoscopic model corresponding to the chip product.

The two-dimensional plane position is positioned in the three-dimensional stereoscopic model corresponding to the chip product according to the three-dimensional position coordinates.

A slice image corresponding to the two-dimensional plane position is acquired from the slice sequence corresponding to the chip product.

The comparison result includes the three-dimensional position coordinates and the slice image.

Optionally, the comparison result further includes at least one of the parameter information or the two-dimensional plane position.

Optionally, the processing module is specifically configured to perform the following operation.

The two-dimensional plane position corresponding to the three-dimensional position coordinates is positioned in the three-dimensional stereoscopic model corresponding to the chip product by adopting a neural network stereoscopic vision positioning.

Optionally, the displaying module is specifically configured to perform the following operation.

The corresponding comparison result is displayed in the three-dimensional stereoscopic model corresponding to each chip product in a graphical user interface.

Or, the comparison result corresponding to each chip product is displayed in a preset comparison result displaying region in the graphical user interface.

In a fourth aspect, an embodiment of the present disclosure provides a modeling device of a chip product, the device includes: an acquiring module and a processing module.

The acquiring module is configured to acquire a slice sequence of a to-be-modeled chip product. The slice sequence includes multiple continuous slice images acquired by slicing the chip product.

The processing module is configured to, according to the slice sequence, perform recombination and construction by using a neural network to acquire a three-dimensional stereoscopic model corresponding to the chip product. The three-dimensional stereoscopic model is used for comparison of parameter information and the slice image between chip products when the chip products are compared.

Optionally, the neural network includes a residual network, a U-net network model and a multi-granularity network model. The processing module is specifically configured to perform the following operations.

Each slice image in the slice sequence is input into the residual network for feature extraction to acquire a first image feature of each slice image.

The slice sequence is segmented through the U-net network model. Each slice image in the segmented slice sequence is input into the residual network for feature extraction to acquire a second image feature of each slice image.

The first image feature and the second image feature of each slice image are merged to acquire an image feature of the slice image.

The three-dimensional stereoscopic model corresponding to the chip product is constructed by adopting the multi-granularity network model according to the slice sequence and the image feature of each slice image.

Optionally, the processing module is specifically configured to perform the following operations.

A grid-shaped three-dimensional geometric shape is generated according to multiple slice images in the slice sequence by adopting the multi-granularity network model and by taking a center of the chip product as a center of a three-dimensional coordinate system.

The image feature of each slice image is embedded into the three-dimensional geometric shape and the training is performed to obtain the three-dimensional stereoscopic model.

Optionally, the image feature of each slice image in the slice sequence includes: a structural feature in the slice image and information about correlation between the slice image and preceding and following images of the slice image in the slice sequence.

In a fifth aspect, an embodiment of the present disclosure provides an electronic device, the device includes: a processor and a memory.

The memory is configured to store a computer program. The processor calls the computer program stored in the memory to perform the method of any one of the first aspect or the second aspect.

In a sixth aspect, an embodiment of the present disclosure provides a computer-readable storage medium. The computer-readable storage medium stores a computer program. When the computer program is executed by a processor, the processor is enabled to perform the method of any one of the first aspect or the second aspect.

An embodiment of the present disclosure provides a comparison method, a modeling method, a device and storage medium for a chip product. The chip product is modeled by using the neural network based on the slice sequence of the chip product in advance to acquire the three-dimensional stereoscopic model. When the chip products are compared, the comparison feature is acquired responsive to the operation of the user. For each chip product, the comparison result corresponding to the comparison feature is acquired from the three-dimensional stereoscopic model corresponding to each chip product. Then, the comparison result corresponding to each chip product is displayed. In this way, there is no need to manually compare pictures through multiple electronic files and no need to process a large amount of information, so that the comparison efficiency and accuracy of the chip products are improved.

DETAILED DESCRIPTION

Figure 1:
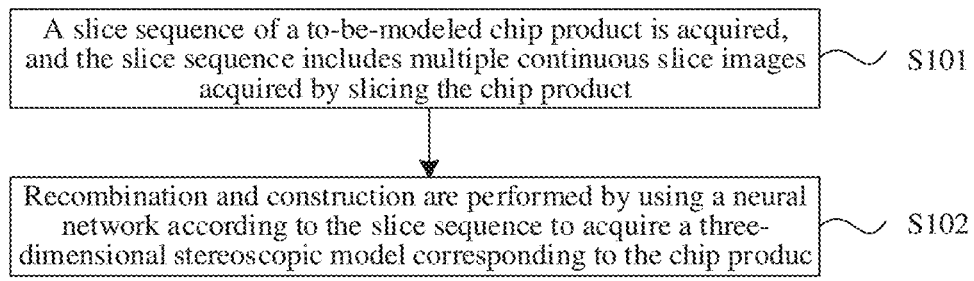
FIG. 1 is a flowchart of a modeling method for a chip product according to a first embodiment of the present disclosure.

Technical solutions of the embodiments of the present disclosure will be clearly and completely described below in combination with the accompanying drawings of the embodiments of the present disclosure. It is apparent that the described embodiments are only part, rather than all, of the embodiments of the present disclosure. Based on the embodiments in the present disclosure, all other embodiments acquired by those skilled in the art without involving any inventive effort shall fall within the scope of protection of the present disclosure.

The terms "first", "second", etc. in the specification and claims of the present disclosure and in the above drawings are used for distinguishing similar objects and not necessarily for describing a specific sequence or sequential order. It is to be understood that such used data may be interchangeable under an appropriate circumstance, so that the embodiments of the present disclosure described herein are, for example, capable of being implemented in a sequence other than those illustrated or described herein.

Furthermore, the terms "include" and "having", as well as any variations thereof, are intended to cover a non-exclusive inclusion, for example, a process, a method, a system, a product, or an apparatus that includes a series of steps or elements is not necessarily limited to those expressly listed steps or elements, but may contain other steps or elements not expressly listed or inherent to such process, method, product, or apparatus.

Chip (that is, an integrated circuit) industry is a strategic, fundamental and leading industry for national economic and social development and plays a key role in several major fields such as a computer, consumer electronics, network communication, and automotive electronics. In a production and application process of a chip product, it is necessary to compare the products and identify features and differences between different chip products. At present, the comparison of the chip product is mainly performed manually. The chip product is analyzed to obtain a two-dimensional picture of a cross section of the chip product. A related parameter is manually marked in the two-dimensional picture, then, the marked two-dimensional picture is sorted into an electronic file, and different files are configured to store the parameters and the pictures of different chip products. When the chip product needs to be compared, multiple files need to be opened manually, each parameter is searched for manual comparison, so that the comparison efficiency is low, and the solution of manual correspondence and marking is relatively poor in accuracy.

For the above problem, the present disclosure provides a modeling method and comparison method for a chip product. The overall idea of the solution is that in a process of solving the above problems, the inventor found that with respect to the same chip product, an internal structure thereof is the same, parameter information of different positions or chips is also consistent, therefore, if the chip product can be digitally modeled, the above problems may be solved through a system automatic comparison model.

On this basis, a cross section image of the chip product may be continuously acquired, the acquired images may be analyzed, and a three-dimensional stereoscopic model is constructed based on an analysis result. By modeling a three-dimensional stereoscopic structure of the chip product, the internal structure of the chip product and related parameter information may be visually checked, and the problem that a specific position cannot be positioned when the chip product is compared is solved. Furthermore, when the chip products are compared, three-dimensional stereoscopic models of different chip products may be compared through the system, the same parameter information or different parameter information, etc. between the chip products may be automatically detected, structures of different positions and pictures of corresponding interfaces may also be directly checked, so that the problems that the comparison of the chip products are poor in efficiency and accuracy are effectively solved.

The solution may be applied to a computer device with computing capability, such as a computer, a personal computer, a smartphone, and other electronic device.

The modeling method and the comparison method for the chip product provided by the present disclosure are described in detail below through several specific embodiments.

FIG. 1 is a flowchart of a modeling method for a chip product according to a first embodiment of the present disclosure. As shown in FIG. 1, the modeling method for the chip product specifically includes the operations S101 to S102.

In operation S101, a slice sequence of a to-be-modeled chip product is acquired. The slice sequence includes multiple continuous slice images acquired by slicing the chip product.

In the operation S101, in order to model the chip product, the slice sequence of the chip product needs to be acquired first. The slice sequence is actually a sequence of some continuous images. These images are the slice images of the chip product. In a specific implementation, the chip product may be continuously sliced according to a certain structure or slicing interval and an image of each slicing section is obtained through shooting or scanning, then multiple continuous slice images are obtained, that is, the slice sequence is obtained.

In operation S102, recombination and construction are performed according to the slice sequence by using a neural network to obtain a three-dimensional stereoscopic model corresponding to the chip product.

The three-dimensional stereoscopic model is used for comparison of parameter information and the slice image between chip products when the chip products are compared.

In the operation S102, after the slice sequence is obtained, the slice sequence may be recombined and constructed through the neural network to obtain the three-dimensional stereoscopic model of the chip product. A specific modeling process may be implemented in the following implementations. The neural network involved in the solution includes a residual network, a U-net network model, and a multi-granularity network model.

After the slice sequence is obtained, each slice image in the slice sequence is input into the residual network for feature extraction to acquire a first image feature of each slice image.

In another branch, the slice sequence is segmented through the U-net network model. Each slice image in the segmented slice sequence is input into the residual network for feature extraction to obtain a second image feature of each slice image. In other words, for the same slice image, the first image feature is a feature directly extracted from the slice image by adopting the residual network, and the second image feature is the feature extracted by segmenting the slice image into small blocks first and then inputting the small blocks into the residual network.

The first image feature and the second image feature of each slice image are merged to acquire an image feature of the slice image. The image feature of the slice image indicates the feature of the image itself. By merging the first image feature and the second image feature, the accuracy of the acquired slice image can be effectively improved. The image feature includes, but is not limited to, a color feature, a texture feature, a shape feature, a depth feature, etc. In a specific implementation of the solution, the image feature of each slice image in the slice sequence includes: a structural feature in the slice image and information about correlation between the slice image and preceding and following images of the slice image in the slice sequence.

After the feature of each slice image is obtained, the three-dimensional stereoscopic model corresponding to the chip product is constructed by adopting the multi-granularity network model according to the slice sequence and the image feature of each slice image.

In a specific embodiment, a grid-shaped three-dimensional geometric shape may be generated according to multiple slice images in the slice sequence by adopting the multi-granularity network model and by taking a center of the chip product as the center of a three-dimensional coordinate system. Then image feature of each slice image is embedded into the three-dimensional geometric shape and the training is performed to obtain the three-dimensional stereoscopic model.

According to the modeling method of a chip product provided by the embodiment, the chip product is modeled by using a neural network based on the slice sequence of the chip product in advance to obtain the three-dimensional stereoscopic model. When the chip products are compared, there is no need to manually compare pictures through multiple electronic files and no need to process a large amount of information, so that the comparison efficiency and accuracy of the chip products are improved.

Figure 2:
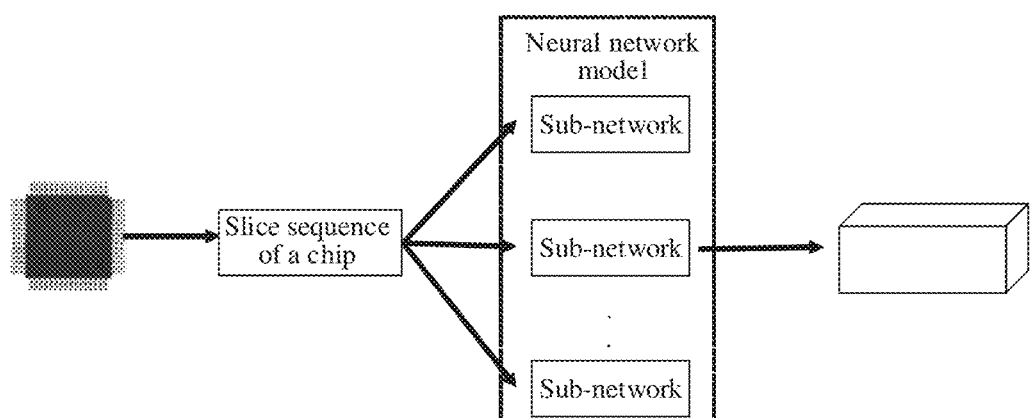
FIG. 2 is a schematic diagram of constructing three-dimensional stereoscopic model of a chip product according to an embodiment of the present disclosure.

FIG. 2 is a schematic diagram of constructing three-dimensional stereoscopic model of a chip product according to an embodiment of the present disclosure. As shown in FIG. 2, based on the above embodiments, in order to reconstruct the three-dimensional stereoscopic model of the chip product more precisely, multiple sub-networks are constructed for extracting information about correlation between upper and lower images, and an overall neural network model is constructed by the multiple sub-networks. After the chip product (that is, a chip in FIG. 2) is sliced to obtain the slice sequence of the chip product, the image feature of the slice image (including a feature of the image itself and the information about correlation between preceding and following images) is extracted through the neural network model by taking the slice sequence of the chip product as an input to reconstruct a three-dimensional structure of the chip.

Based on any above embodiment, the modeling method for the chip product is illustrated below through a specific implementation process.

Figure 3:
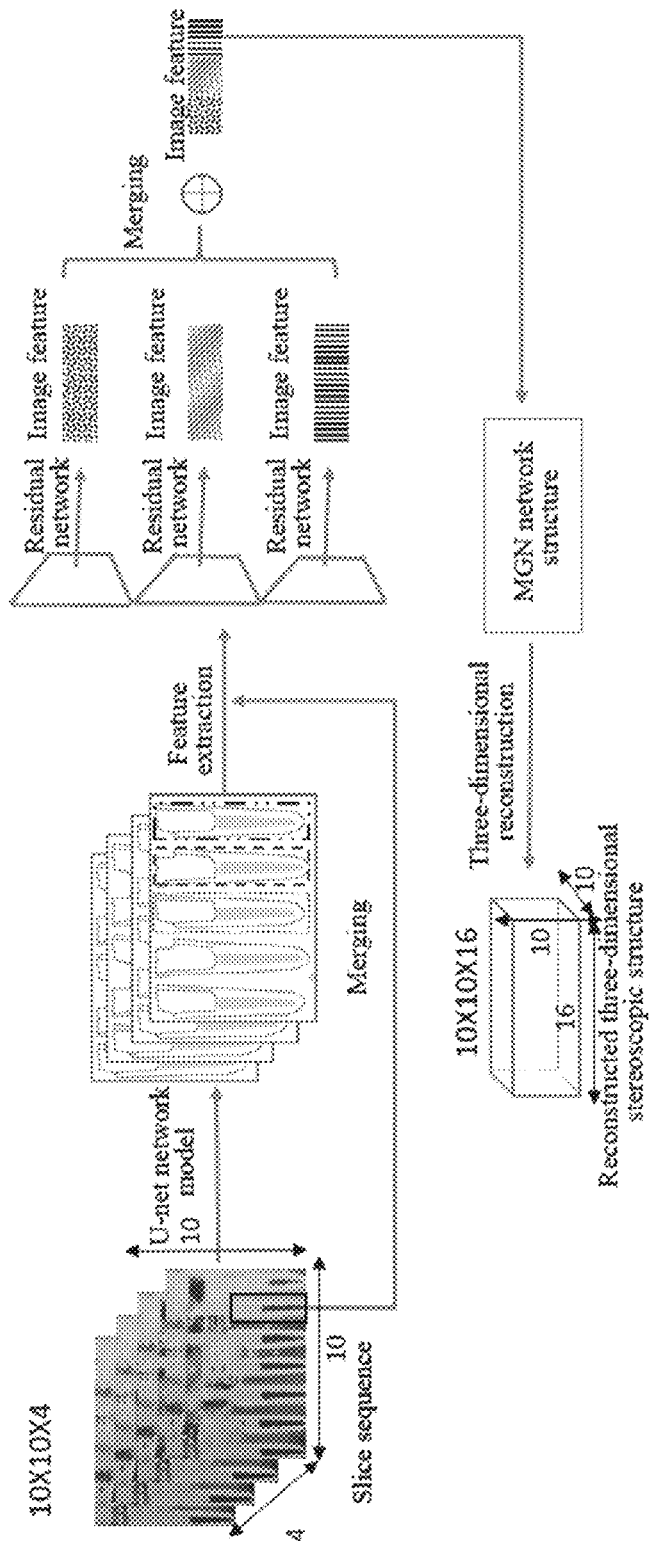
FIG. 3 is a schematic diagram of constructing three-dimensional stereoscopic model of a chip product by adopting a neural network model according to an embodiment of the present disclosure.

FIG. 3 is a schematic diagram of constructing three-dimensional stereoscopic model of a chip product by adopting a neural network model according to an embodiment of the present disclosure. As shown in FIG. 3, the slice sequence is segmented through the U-Net network model, feature extraction is performed on segmented different regions through each Residual Network (ResNet), and extracted features are merged, that is, the second image feature in the foregoing solution is obtained. Meanwhile, for each slice image in the slice sequence, the feature thereof may also be extracted in a case where the slice image is not segmented, and in a specific implementation, the feature extraction may also be performed by the residual network, that is, the first image feature in the foregoing solution is obtained. In order to improve the accuracy of a feature value, an original image (or the feature extracted from the original image) and the feature of the segmented image are merged to obtain a final image feature. The image feature may also be represented as additional feature data in the image, that is, may also become a feature image.

After the foregoing processing is performed, a three-dimensional geometric shape is generated from a grid by using the Multigranularity network (MGN) model according to a feature map and by taking the center of the chip product as a standard coordinate system. The image feature of each slice image output by each sub-network is embedded into the three-dimensional geometric shape, so that joint training and reasoning can be performed, thereby reconstructing (that is, recombination shown in FIG. 3) a three-dimensional stereoscopic structure containing more features to obtain the three-dimensional stereoscopic model of the chip product. For example, the slice sequence with a dimension of 10×10×4 may be input into the neural network and becomes the three-dimensional stereoscopic structure with a dimension of 10×10×16 after feature extraction and recombination. 16-dimensional depth may be obtained through feature learning and recombination according to the slice sequence with 4-dimensional depth, so that the three-dimensional model of the chip product entity may be restored more precisely. It is to be understood that the dimension of the slice sequence and the dimension of a recombined three-dimensional stereoscopic structure are only illustrated as an example and should not be construed as any limitation of the implementation process of the embodiments of the present disclosure.

For each type of chip product, modeling may be performed in the above manner to obtain the corresponding three-dimensional stereoscopic model, and furthermore, parameter information of the chip product may be correlated in the three-dimensional stereoscopic model, so that required parameter information may be called when comparison or inquiry is performed.

According to the modeling method for a chip product provided by the foregoing embodiments, by acquiring the slice sequence of the chip product as an input of the neural network model, the three-dimensional stereoscopic structure of a chip product model may be reconstructed. In an application process of the model, the image and the parameter information of each position may be visually displayed according to an operation of a user. No matter in the application process of the comparison of the chip products and an understanding of the chip internal structure, etc., the efficiency may be effectively improved, the possibility that an error may occur in manual comparison is avoided, and the precision is improved.

Figure 4:
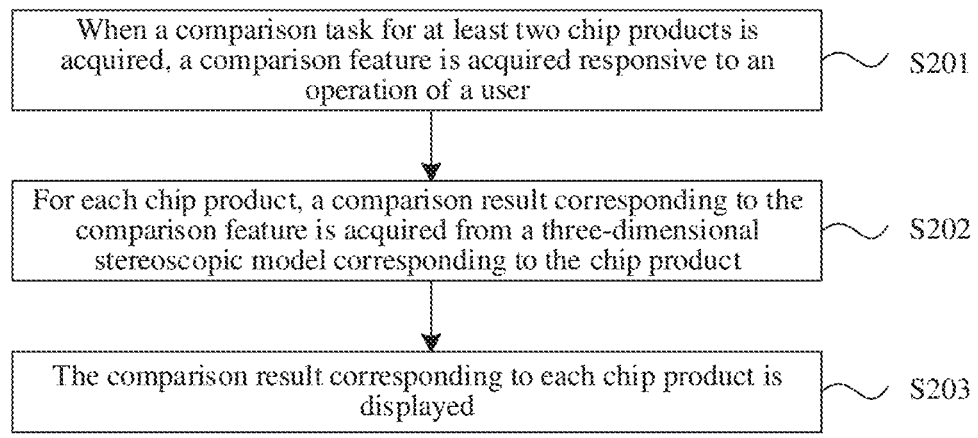
FIG. 4 is a flowchart of a comparison method for a chip product according to an embodiment of the present disclosure.

FIG. 4 is a flowchart of a comparison method for a chip product according to an embodiment of the present disclosure. As shown in FIG. 4, after the three-dimensional stereoscopic models corresponding to different chip products are obtained through the solution provided by the foregoing embodiments. The operations S201 to S203 are specifically included when the chip product is compared.

In operation S201, when a comparison task for at least two chip products is acquired, a comparison feature is acquired responsive to an operation of a user.

In a specific implementation of the solution, a comparison solution of the chip products is implemented in a software system. The system includes a graphical user interface for interacting with a user, and also includes a database for storing data in a background, etc. In an application and production process of the chip product, when multiple chip products need to be compared, the user may select and import three-dimensional stereoscopic models corresponding to different chips through the software system, or may directly select an identifier of the chip product to acquire the three-dimensional stereoscopic model.

In the operation S201, when the chip products need to be compared, the user may input a comparison feature through an operation. The comparison feature may be a certain position in the chip product, that is, the user may directly select the position in the three-dimensional stereoscopic model corresponding to the certain chip product. The system may acquire three-dimensional position coordinates of the selected position, and the three-dimensional position coordinates are taken as the comparison feature. Optionally, the comparison feature may be any parameter of the chip product. The user may input a parameter required to be compared through an input box provided on the graphical user interface provided by the system, or different parameters may be directly displayed on the graphical user interface, and the user clicks to select the parameter required to be compared.

In summary, the acquisition of the comparison feature at least includes the following two manners: a first manner of acquiring the three-dimensional position coordinates corresponding to a selected position, responsive to the position being selected by the user in the three-dimensional stereoscopic model of any one of the at least two chip products; and a second manner of receiving the parameter information of a chip product required to be compared input by the user.

In operation S202, for each chip product, a comparison result corresponding to the comparison feature is acquired from the three-dimensional stereoscopic model corresponding to the chip product.

The three-dimensional stereoscopic model corresponding to each chip product is a three-dimensional model which is recombined and constructed by using a neural network according to a slice sequence of the chip product. A specific modeling process refers to the foregoing embodiments.

In the operation S202, after acquiring the comparison feature according to the operation of the user, the system for comparing the chip products acquire other parameter features corresponding to the comparison feature, or position coordinates, or an image of a corresponding position from the three-dimensional stereoscopic model corresponding to each chip product as the comparison result. What content is contained in a specific comparison result is different according to the difference of the comparison feature.

In a specific implementation manner, when the comparison feature includes the three-dimensional position coordinates of the chip product required to be compared, a process of acquiring the comparison result according to the three-dimensional stereoscopic model specifically includes that: for each chip product, a two-dimensional plane position is positioned in the three-dimensional stereoscopic model corresponding to the chip product according to the three-dimensional position coordinates. Then, a slice image corresponding to the two-dimensional plane position is acquired from a slice sequence corresponding to the chip product, and parameter information at the three-dimensional position coordinates is acquired from stored parameters of the chip product. The comparison result includes the slice image and the parameter information. The parameter information herein refers to parameters of the chip product itself, such as some parameters about devices and performance of the chip product.

Optionally, in a comparison process of the chip products, the two-dimensional plane position or the three-dimensional position coordinates may also be displayed in the graphical user interface, which is not limited by the solution.

In another specific implementation manner, when the comparison feature includes the parameter information of the chip product required to be compared, a process of acquiring the comparison result from the three-dimensional stereoscopic model corresponding to the chip product specifically includes that: for each chip product, the three-dimensional position coordinates corresponding to the parameter information are positioned in the three-dimensional stereoscopic model corresponding to the chip product; the two-dimensional plane position is positioned in the three-dimensional stereoscopic model corresponding to the chip product according to the three-dimensional position coordinates; and the slice image corresponding to the two-dimensional plane position is acquired from the slice sequence corresponding to the chip product. The comparison result includes the three-dimensional position coordinates and the slice image.

In the solution, a position of the parameter in the chip product may be positioned according to a certain parameter of the chip product, which may be used as the comparison result together with a specific slice image corresponding to the parameter. (此处翻译不确定) In practical application, the parameter information of the chip product may also include other parameter information, which may also be displayed as the comparison result.

Optionally, in a comparison process of the chip products, the two-dimensional plane position or the three-dimensional position coordinates may also be displayed in the graphical user interface, which is not limited by the solution.

That is, in the implementation of such solution, the comparison result may also include at least one of the selected parameter information as the comparison feature, other parameter information or the two-dimensional plane position, etc.

In any one implementation manner, the specific implementation manner of positioning a two-dimensional position plane in the three-dimensional stereoscopic model according to the three-dimensional position coordinates may include that: the two-dimensional plane position corresponding to the three-dimensional position coordinates is positioned in the three-dimensional stereoscopic model corresponding to the chip product by adopting a neural network stereoscopic vision positioning.

The neural network stereoscopic vision positioning mainly includes that according to a stereoscopic vision principle, a nonlinear mapping relation is constructed between the three-dimensional coordinates and image coordinates of a space point by using the neural network, so that the system may realize one-to-one correspondence between a two-dimensional coordinates and a three-dimensional coordinates without complicated calibration of internal and external parameters of a camera, calibration and positioning calculation of a vision system are simplified. Compared with a conventional method, the method according to the present disclosure is more scientific and achieves a good effect on the accuracy of the positioning.

In operation S203, the comparison result corresponding to each chip product is displayed.

In the operation S203, after the comparison result of the chip product is acquired, the comparison result may be displayed in the graphical user interface of a comparison system. In a specific graphical user interface, the three-dimensional stereoscopic models of different chip products may be displayed, and at this time, the comparison result may be directly displayed in the three-dimensional stereoscopic model of the chip product and may also be independently displayed in a preset region for displaying comparison result. That is, the corresponding comparison result is displayed in the three-dimensional stereoscopic model corresponding to each chip product in the graphical user interface, or the comparison result corresponding to each chip product is displayed in the preset region for displaying comparison result.

According to the comparison method of a chip product, the chip product is modeled by the neural network based on the slice sequence of the chip product in advance to acquire the three-dimensional stereoscopic model. When the chip products are compared, the comparison feature is acquired responsive to the operation of the user. For each chip product, the comparison result corresponding to the comparison feature is acquired from the three-dimensional stereoscopic model corresponding to each chip product. Then, the comparison result corresponding to each chip product is displayed. There is no need to manually compare pictures through multiple electronic files and no need to process a large amount of information, so that the comparison efficiency and accuracy of the chip products are improved.

Based on any above embodiment, the solution is illustrated below through a specific comparison process of a chip product.

The core idea of the technical solution according to the present disclosure includes that a segmented sequence of a chip product is taken as an input, and three-dimensional stereoscopic structure of the chip product, that is, the three-dimensional stereoscopic model, is reconstructed by using a neural network method, so that the internal overall structure of the chip and related information thereof may be visually checked, and the problem that the specific position of an chip entity cannot be positioned is solved. When multiple chip products are compared, any product is selected as a target group, and the other products are selected as a control group. When the three-dimensional stereoscopic model of the chip product in the target group is selected, the same target region is displayed in the control group through target automatic detection and positioning, and corresponding two-dimensional sequence image and related parameter information are displayed, so that the problems of the efficiency and accuracy of the parameter comparison are effectively solved.

Figure 5:
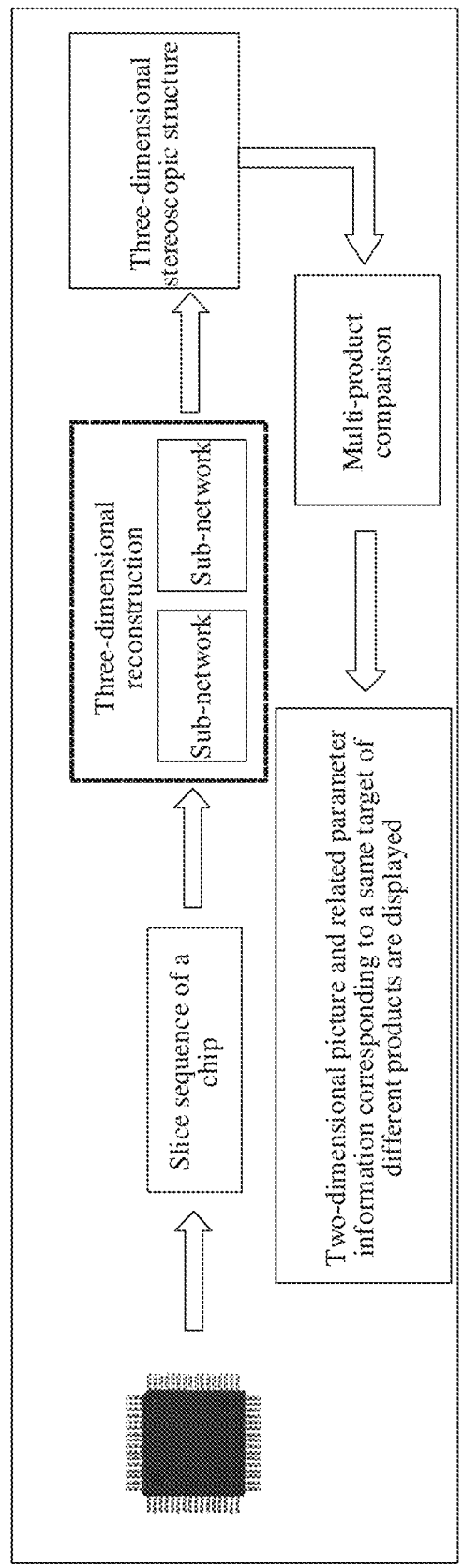
FIG. 5 is a schematic diagram of a modeling and comparison process of a chip product according to an embodiment of the present disclosure.

FIG. 5 is a schematic diagram of a modeling and comparison process of a chip product according to an embodiment of the present disclosure. As shown in FIG. 5, before the chip products are compared, each chip product is sliced in a certain manner (for example, the slicing is performed directly according to a certain interval to acquire the slice image, or the chip product is ground, and continuous images are acquired in a grinding process) to acquire a series of slice sequences. Then, the slice sequence of each chip product is recombined by using the neural network, the three-dimensional stereoscopic structure is constructed to acquire three-dimensional stereoscopic model, and the three-dimensional model may be imported into the developed comparison system. Based on the foregoing preparation process, when chip products are compared, any position of the three-dimensional stereoscopic model corresponding to any chip product is selected, and for the other products, a target region same as a region corresponding to the selected position may be automatically detected and positioned, and a corresponding two-dimensional picture (that is, the slice image) and a specific related parameter are displayed.

Figure 6:
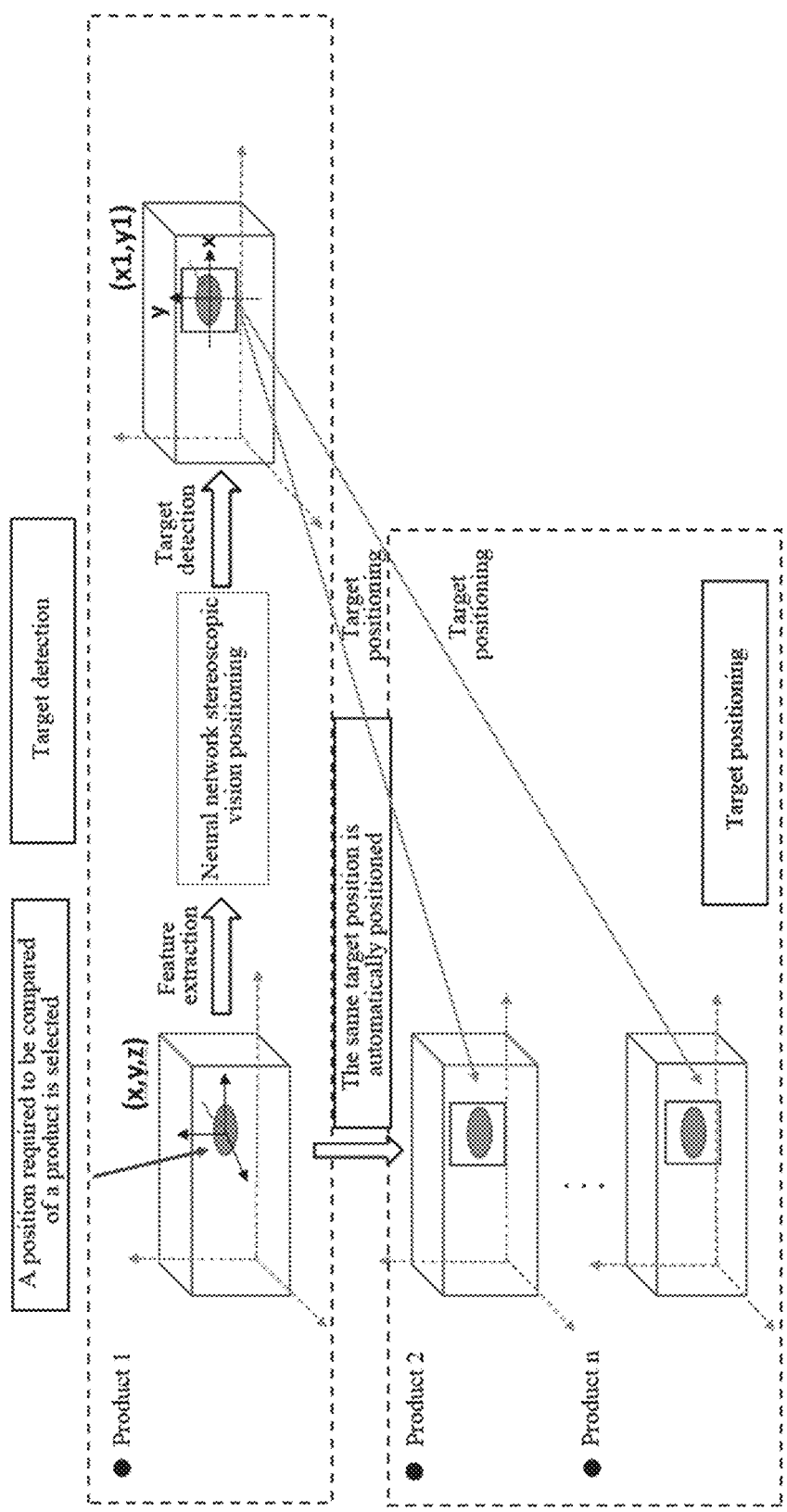
FIG. 6 is a schematic diagram of a comparison of a chip product according to an embodiment of the present disclosure.

FIG. 6 is a schematic diagram of a comparison of a chip product according to an embodiment of the present disclosure. As shown in FIG. 6, a specific manner of comparing multiple chip products is shown. A product 1 is taken as the target group, and a user may manually select a position required to be compared in the product 1. The position may be represented by the three-dimensional position coordinates (x,y,z). The comparison system performs feature extraction on the position; target detection is performed by adopting the neural network stereoscopic vision positioning; the two-dimensional plane position (x1,y1) corresponding to the selected position is positioned; and then, the same target positions in other product 2, . . . , and product n are automatically positioned.

Furthermore, the slice image and parameter information of different chip products at the position may be acquired through the two-dimensional plane position and the acquired slice image and the parameter information are taken as the comparison result of the comparison of the chip product this time.

Alternatively, in another implementation, according to the target region selected in the product 1, the same target region is automatically detected and positioned in other products, and the two-dimensional picture and the parameter information corresponding to each product are displayed, so that the comparison is implemented rapidly. For example, the two-dimensional plane position (x1,y1) in the product 1 may be selected, and when detecting that the parameter information corresponding to the two-dimensional plane position (x1,y1) contains a structure name, the two-dimensional picture related to the structure name corresponding to each product may be displayed.

According to the modeling method and comparison method for a chip product according to the embodiment of the present disclosure, by reconstructing the three-dimensional structure of the chip product, an internal parameter and structure of each chip product may be visually checked. Furthermore, when the chip products are compared, a target automatic detection and positioning method is used, so that the same target region in each chip product is displayed simultaneously, and the efficiency and accuracy of the comparison are effectively improved. Furthermore, in a comparison process, a region in the three-dimensional stereoscopic model corresponding to any chip product is selected, the target group and the control group may have their corresponding two-dimensional pictures and corresponding related specific parameter information displayed, so that the difference of the same parameter among the products may be visually compared and checked.

Figure 7:
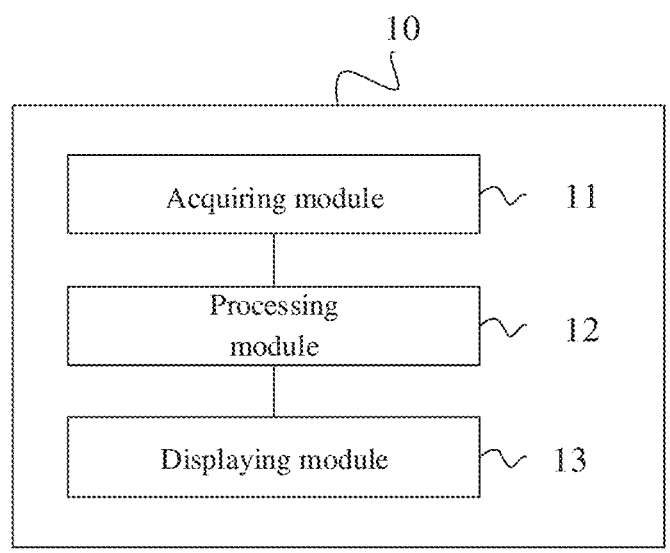
FIG. 7 is a schematic structural diagram of a comparison device for a chip product according to an embodiment of the present disclosure.

FIG. 7 is a schematic structural diagram of a comparison device for a chip product according to an embodiment of the present disclosure. As shown in FIG. 7, the comparison device 10 for a chip product includes an acquiring module 11, a processing module 12, and a displaying module 13.

The acquiring module 11 is configured to, when a comparison task for at least two chip products is acquired, acquire a comparison feature responsive to an operation of a user.

The processing module 12 is configured to, for each chip product, acquire a comparison result corresponding to the comparison feature from a three-dimensional stereoscopic model corresponding to the chip product. The three-dimensional stereoscopic model corresponding to each chip product is a three-dimensional model which is recombined and constructed by using a neural network according to a slice sequence of the chip product.

The displaying module 13 is configured to display the comparison result corresponding to each chip product.

Optionally, the comparison feature includes three-dimensional position coordinates or parameter information of the chip product required to be compared. The acquiring module 11 is specifically configured to execute the following operation.

Responsive to a position being selected by the user in the three-dimensional stereoscopic model of any one of the at least two chip products, the three-dimensional position coordinates corresponding to the selected position are acquired.

Or, parameter information of the chip product required to be compared input by the user is received.

Optionally, the comparison feature includes the three-dimensional position coordinates of the chip product required to be compared. The processing module 12 is specifically configured to perform the following operations.

For each chip product, a two-dimensional plane position is positioned in the three-dimensional stereoscopic model corresponding to the chip product according to the three-dimensional position coordinates.

A slice image corresponding to the two-dimensional plane position is acquired from the slice sequence corresponding to the chip product.

Parameter information at the three-dimensional position coordinates is acquired from stored parameters of the chip product.

The comparison result includes the slice image and the parameter information.

Optionally, the comparison feature includes the parameter information of the chip product required to be compared. The processing module 12 is specifically configured to perform the following operations.

For each chip product, the three-dimensional position coordinates corresponding to the parameter information are positioned in the three-dimensional stereoscopic model corresponding to the chip product.

The two-dimensional plane position is positioned in the three-dimensional stereoscopic model corresponding to the chip product according to the three-dimensional position coordinates.

A slice image corresponding to the two-dimensional plane position is acquired from the slice sequence corresponding to the chip product.

The comparison result includes the three-dimensional position coordinates and the slice image.

Optionally, the comparison result further includes at least one of the parameter information or the two-dimensional plane position.

Optionally, the processing module 12 is specifically configured to perform the following operation.

The two-dimensional plane position corresponding to the three-dimensional position coordinates is positioned in the three-dimensional stereoscopic model corresponding to the chip product by adopting a neural network stereoscopic vision positioning.

Optionally, the displaying module 13 is specifically configured to perform the following operation.

The corresponding comparison result is displayed in the three-dimensional stereoscopic model corresponding to each chip product in a graphical user interface.

Or, the comparison result corresponding to each chip product is displayed in a preset region for displaying the comparison result in the graphical user interface.

The comparison device for a chip product provided by any foregoing embodiments and the technical solutions for implementing the comparison method for a chip product in the foregoing embodiments are similar in implementation principle and technical effect, which will not be described in detail herein.

Figure 8:
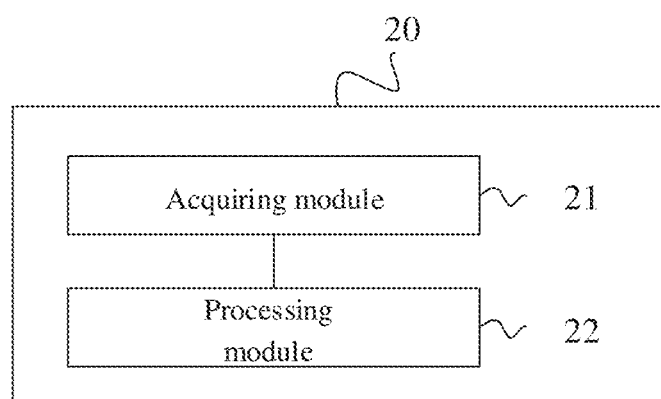
FIG. 8 is a schematic structural diagram of a modeling device for a chip product according to an embodiment of the present disclosure.

FIG. 8 is a schematic structural diagram of a modeling device for a chip product according to an embodiment of the present disclosure. As shown in FIG. 8, the modeling device 20 of a chip product includes an acquiring module 21 and a processing module 22.

The acquiring module 21 is configured to acquire a slice sequence of a to-be-modeled chip product. The slice sequence includes multiple continuous slice images acquired by slicing the chip product.

The processing module 22 is configured to, according to the slice sequence, perform recombination and construction by using a neural network to acquire a three-dimensional stereoscopic model corresponding to the chip product. The three-dimensional stereoscopic model is used for comparison of parameter information and the slice image between chip products when the chip products are compared.

Optionally, the neural network includes a residual network, a U-net network model and a multi-granularity network model. The processing module 22 is specifically configured to perform the following operations.

Each slice image in the slice sequence is input into the residual network for feature extraction to acquire a first image feature of each slice image.

The slice sequence is segmented through the U-net network model. Each slice image in the segmented slice sequence is input into the residual network for feature extraction to acquire a second image feature of each slice image.

The first image feature and the second image feature of each slice image are merged to acquire an image feature of the slice image.

The three-dimensional stereoscopic model corresponding to the chip product is constructed by adopting the multi-granularity network model according to the slice sequence and the image feature of each slice image.

Optionally, the processing module 22 is specifically configured to perform the following operation.

A grid-shaped three-dimensional geometric shape is generated according to multiple slice images in the slice sequence by adopting the multi-granularity network model and by taking a center of the chip product as the center of a three-dimensional coordinate system.

The image feature of each slice image is embedded into the three-dimensional geometric shape and the training is performed to obtain the three-dimensional stereoscopic model.

Optionally, the image feature of each slice image in the slice sequence includes: a structural feature in the slice image and information about correlation between the slice image and preceding and following images of the slice image in the slice sequence.

The modeling device for a chip product provided by any foregoing embodiments and the technical solutions for implementing the modeling method for a chip product in the foregoing embodiments are similar in implementation principle and technical effect, which will not be described in detail herein.

Figure 9:
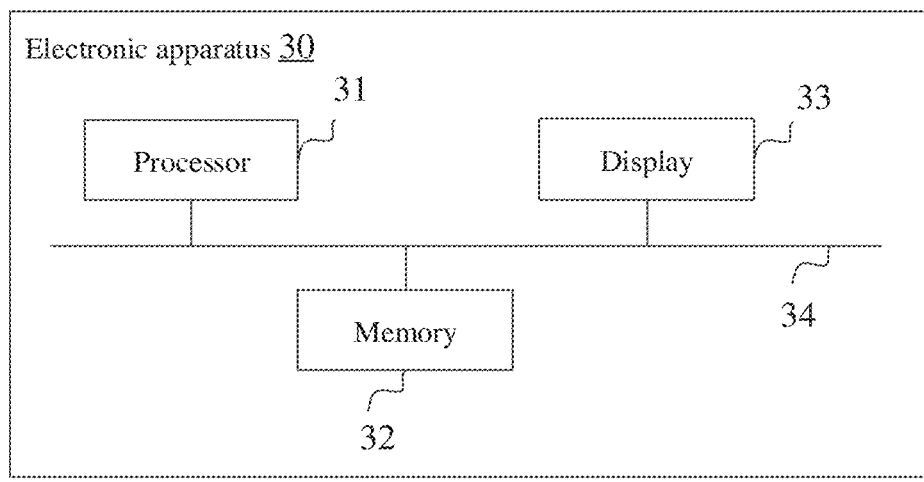
FIG. 9 is a schematic structural diagram of an electronic device according to an embodiment of the present disclosure.

FIG. 9 is a schematic structural diagram of an electronic apparatus device according to an embodiment of the present disclosure. As shown in FIG. 9, the electronic device 30 includes: a processor 31 and a memory 32.

Optionally, the electronic device may also include a display 33 and a bus 34 for connecting elements.

The memory 32 is configured to store a computer program. The processor 31 calls the computer program stored in the memory 32 to perform the technical solutions in any method embodiment.

Optionally, the memory 32 may be independent and may also be integrated with the processor 31.

An embodiment of the present disclosure further provides a computer-readable storage medium. The computer-readable storage medium stores a computer program. When the computer program is executed by a processor, the processor is enabled to perform the technical solutions in any method embodiment.

It will be appreciated that the processor mentioned in the embodiments of the present disclosure may be a Central Processing Unit (CPU), and may also be other general purpose processor, a Digital Signal Processor (DSP), an Application Specific Integrated Circuit (ASIC), a Field Programmable Gate Array (FPGA) or other programmable logic device, a discrete gate or a transistor logic device, a discrete hardware component, etc. The general purpose processor may be a microprocessor or the processor may also be any conventional processor, etc.

It will be further appreciated that the memory mentioned in the embodiment of the present disclosure may be a volatile memory or a nonvolatile memory, or may include both the volatile memory and the nonvolatile memory. The nonvolatile memory may be a Read-Only Memory (ROM), a Programmable ROM (PROM), an Erasable PROM (EPROM), and an Electrically PROM (EEPROM), or a flash memory. The volatile memory may be a Random Access Memory (RAM), which is used as an external cache. By exemplary and not restrictive illustration, many forms of RAM are available, such as a Static RAM (SRAM), a Dynamic RAM (DRAM), a Synchronous DRAM (SDRAM), a Double Data Rate Synchronous DRAM (DDR SDRAM), an Enhanced SDRAM (ESDRAM), a Synchlink DRAM (SLDRAM), and a Direct Rambus RAM (DR RAM).

It is to be noted that when the processor is the general purpose processor, the DSP, the ASIC, the FPGA or other programmable logic device, the discrete gate or transistor logic device, or the discrete hardware component, the memory (a storage module) is integrated into the processor.

It is to be understood that the memory described herein is intended to include, but is not limited to, these and any other suitable types of memory.

It will be appreciated that in various embodiments of the present disclosure, the magnitude of serial numbers in each above process is not meant to imply an order of execution. The order of execution of each process should be determined by a function and inherent logic thereof, and should not be construed as any limitation to the implementations of the embodiments of the present disclosure.

The above descriptions are only specific embodiments of the present disclosure, but the scope of protection of the present disclosure is not limited to this. Any changes or substitutions that may be easily made by those skilled in the art within the technical scope disclosed in the present disclosure should be included within the scope of protection of the present disclosure. Therefore, the scope of protection of the present disclosure shall be determined by the appended claims.

The invention claimed is:

1. A comparison method for a chip product, comprising:
when a comparison task for at least two chip products is acquired, acquiring a comparison feature responsive to an operation of a user;
for each chip product of the at least two chip products, acquiring a comparison result corresponding to the comparison feature from a three-dimensional stereoscopic model corresponding to the chip product, wherein the three-dimensional stereoscopic model corresponding to each chip product is a three-dimensional model which is recombined and constructed by using a neural network according to a slice sequence of the chip product; and
displaying the comparison result corresponding to each chip product,
wherein:
the comparison feature comprises three-dimensional position coordinates of a chip product required to be compared; and acquiring the comparison feature responsive to the operation of the user comprises:
responsive to a position being selected by the user in the three-dimensional stereoscopic model of any one of the at least two chip products, acquiring the three-dimensional position coordinates corresponding to the selected position,
wherein for each chip product, acquiring the comparison result corresponding to the comparison feature from the three-dimensional stereoscopic model corresponding to the chip product comprises:
for each chip product, positioning a two-dimensional plane position in the three-dimensional stereoscopic model corresponding to the chip product according to the three-dimensional position coordinates,
acquiring a slice image corresponding to the two-dimensional plane position from the slice sequence corresponding to the chip product, and
acquiring parameter information at the three-dimensional position coordinates from stored parameters of the chip product,
wherein the comparison result comprises the slice image and the parameter information; or,
the comparison feature comprises the parameter information of the chip product required to be compared; and acquiring the comparison feature responsive to the operation of the user comprises:
receiving the parameter information of the chip product required to be compared input by the user,
wherein for each chip product, acquiring the comparison result corresponding to the comparison feature from the three-dimensional stereoscopic model corresponding to the chip product comprises:
for each chip product, positioning the three-dimensional position coordinates corresponding to the parameter information in the three-dimensional stereoscopic model corresponding to the chip product,
positioning the two-dimensional plane position in the three-dimensional stereoscopic model corresponding to the chip product according to the three-dimensional position coordinates, and
acquiring the slice image corresponding to the two-dimensional plane position from the slice sequence corresponding to the chip product,
wherein the comparison result comprises the three-dimensional position coordinates and the slice image.

2. The method of claim 1, wherein when the comparison feature comprises the parameter information of the chip product required to be compared, the comparison result further comprises at least one of the parameter information or the two-dimensional plane position.

3. The method of claim 1, wherein positioning the two-dimensional plane position in the three-dimensional stereoscopic model corresponding to the chip product according to the three-dimensional position coordinates comprises:
 positioning the two-dimensional plane position corresponding to the three-dimensional position coordinates in the three-dimensional stereoscopic model corresponding to the chip product by adopting neural network stereoscopic vision positioning.

4. The method of claim 1, wherein displaying the comparison result corresponding to each chip product comprises:
 displaying the corresponding comparison result in the three-dimensional stereoscopic model corresponding to each chip product in a graphical user interface;
 or,
 displaying the comparison result corresponding to each chip product in a preset region for displaying the comparison result in the graphical user interface.

5. The method of claim 1, wherein a non-transitory computer-readable storage medium has stored therein computer-readable instructions that, when executed by a processor, causes the processor to perform the method.

6. A modeling method for a chip product, comprising:
 acquiring a slice sequence of a to-be-modeled chip product, the slice sequence comprising a plurality of continuous slice images acquired by slicing the chip product; and
 performing, according to the slice sequence, recombination and construction by using a neural network to obtain a three-dimensional stereoscopic model corresponding to the chip product, wherein the three-dimensional stereoscopic model is used for comparison of parameter information and a slice image of the plurality of continuous slice images between chip products when the chip products are compared,
 wherein the neural network comprises a residual network, a U-net network model and a multi-granularity network model; and performing, according to the slice sequence, recombination and construction by using the neural network to obtain the three-dimensional stereoscopic model corresponding to the chip product comprises:
  inputting each slice image in the slice sequence into the residual network so as to be subjected to feature extraction to obtain a first image feature of each slice image;
  segmenting the slice sequence through the U-net network model, and inputting each slice image in the segmented slice sequence into the residual network so as to be subjected to feature extraction to obtain a second image feature of each slice image;
  merging the first image feature and the second image feature of each slice image to acquire an image feature of the slice image; and
  constructing the three-dimensional stereoscopic model corresponding to the chip product by adopting the multi-granularity network model according to the slice sequence and the image feature of each slice image.

7. The method of claim 6, wherein constructing the three-dimensional stereoscopic model corresponding to the chip product by adopting the multi-granularity network model according to the slice sequence and the image feature of each slice image comprises:
 generating a grid-shaped three-dimensional geometric shape according to a plurality of slice images in the slice sequence by adopting the multi-granularity network model and by taking a center of the chip product as a center of a three-dimensional coordinate system; and
 embedding the image feature of each slice image into the grid-shaped three-dimensional geometric shape and training based on the grid-shaped three-dimensional geometric shape embedded with the image feature to acquire the three-dimensional stereoscopic model.

8. The method of claim 6, wherein the image feature of each slice image in the slice sequence comprises: a structural feature in the slice image, and information about correlation between the slice image and preceding and following images of the slice image in the slice sequence.

9. An electronic device, comprising:
 a memory storing processor-executable instructions; and
 a processor arranged to execute the stored processor-executable instructions to perform steps of:
  when a comparison task for at least two chip products is acquired, acquiring a comparison feature responsive to an operation of a user;
  for each chip product of the at least two chip products, acquiring a comparison result corresponding to the comparison feature from a three-dimensional stereoscopic model corresponding to the chip product, wherein the three-dimensional stereoscopic model corresponding to each chip product is a three-dimensional model which is recombined and constructed by using a neural network according to a slice sequence of the chip product; and
  displaying the comparison result corresponding to each chip product,
 wherein:
  the comparison feature comprises three-dimensional position coordinates of a chip product required to be compared; and acquiring the comparison feature responsive to the operation of the user comprises:
   responsive to a position being selected by the user in the three-dimensional stereoscopic model of any one of the at least two chip products, acquiring the three-dimensional position coordinates corresponding to the selected position,
  wherein for each chip product, acquiring the comparison result corresponding to the comparison feature from the three-dimensional stereoscopic model corresponding to the chip product comprises:
   for each chip product, positioning a two-dimensional plane position in the three-dimensional stereoscopic model corresponding to the chip product according to the three-dimensional position coordinates,
   acquiring a slice image corresponding to the two-dimensional plane position from the slice sequence corresponding to the chip product, and
   acquiring parameter information at the three-dimensional position coordinates from stored parameters of the chip product,
  wherein the comparison result comprises the slice image and the parameter information; or, the comparison feature comprises the parameter information of the chip product required to be compared; and acquiring the comparison feature responsive to the operation of the user comprises:
  receiving the parameter information of the chip product required to be compared input by the user,
  wherein for each chip product, acquiring the comparison result corresponding to the comparison feature from the three-dimensional stereoscopic model corresponding to the chip product comprises:
    for each chip product, positioning the three-dimensional position coordinates corresponding to the parameter information in the three-dimensional stereoscopic model corresponding to the chip product,
    positioning the two-dimensional plane position in the three-dimensional stereoscopic model corresponding to the chip product according to the three-dimensional position coordinates, and acquiring the slice image corresponding to the two-dimensional plane position from the slice sequence corresponding to the chip product,
  wherein the comparison result comprises the three-dimensional position coordinates and the slice image.

10. The electronic device of claim 9, wherein when the comparison feature comprises the parameter information of the chip product required to be compared, the comparison result further comprises at least one of the parameter information or the two-dimensional plane position.

11. The electronic device of claim 9, wherein positioning the two-dimensional plane position in the three-dimensional stereoscopic model corresponding to the chip product according to the three-dimensional position coordinates comprises:
  positioning the two-dimensional plane position corresponding to the three-dimensional position coordinates in the three-dimensional stereoscopic model corresponding to the chip product by adopting neural network stereoscopic vision positioning.

12. The electronic device of claim 9, wherein displaying the comparison result corresponding to each chip product comprises:
  displaying the corresponding comparison result in the three-dimensional stereoscopic model corresponding to each chip product in a graphical user interface;
  or,
  displaying the comparison result corresponding to each chip product in a preset region for displaying the comparison result in the graphical user interface.

\* \* \* \* \*